United States Patent [19]
Mihara

[11] Patent Number: 6,071,828
[45] Date of Patent: Jun. 6, 2000

[54] SEMICONDUCTOR DEVICE MANUFACTURING METHOD INCLUDING PLASMA ETCHING STEP

[75] Inventor: Satoru Mihara, Kawasaki, Japan

[73] Assignee: Fujitsu Limited, Kawasaki, Japan

[21] Appl. No.: 09/228,565

[22] Filed: Jan. 12, 1999

[30] Foreign Application Priority Data

Jun. 22, 1998 [JP] Japan ................................. 10-175180

[51] Int. Cl.[7] .................................................. H01L 21/00
[52] U.S. Cl. ........................ 438/742; 156/345; 438/720
[58] Field of Search ................................. 438/720, 722, 438/742, 713; 156/345 P, 345 C; 216/67, 68, 75, 76, 81

[56] References Cited

U.S. PATENT DOCUMENTS 5,268,200  12/1993  Steger ................................ 156/345 X
5,443,686  8/1995  Jones et al. .......................... 156/345 X Primary Examiner—William Powell
Attorney, Agent, or Firm—Armstrong, Westerman, Hattori, McLeland & Naughton

[57] ABSTRACT

A carbon-containing film, which is made of a carbon-containing material, is adhered to the inner wall of a chamber. A semiconductor substrate is arranged in the chamber whose inner wall has the carbon-containing film adhered thereto. A plasma of a process gas which contains a rare gas is generated in the chamber, and such an electric field as to cause ions contained in the plasma to be attracted to a surface of the semiconductor substrate is applied in order to etch a part of the surface layer of the semiconductor substrate. During the etching, a film which contains a constituent or constituents of an etched film adheres to the surface of the carbon-containing film. The carbon-containing film prevents the peeling off of such an adhering film from the inner wall of the chamber, thereby reducing the generation of particles.

11 Claims, 5 Drawing Sheets

SEMICONDUCTOR DEVICE MANUFACTURING METHOD INCLUDING PLASMA ETCHING STEP

This application is based on Japanese Patent Application No. 10-175180 filed on Jun. 22, 1998, the entire contents of which are incorporated herein by reference.

BACKGROUND OF THE INVENTION

1. Field of the Invention

The present invention relates to a semiconductor device manufacturing method, and more particularly to a semiconductor device manufacturing method including the step of etching a substrate surface by using a plasma.

2. Description of the Related Art

In a semiconductor process, a plasma is often used to etch a thin film on a semiconductor substrate.

A thin film which is made of a material such as platinum (Pt) whose vapor pressure is low is etched mainly by a physical etching. For example, a bias voltage is applied to a semiconductor substrate, thereby generating an electric field in a plasma. Due to the electric field, the ions contained in the plasma are attracted to the semiconductor substrate and etch the thin film. The Pt film is used as an electrode for a dielectric capacitor, for example.

A material such as Pt whose vapor pressure is low is etched mainly by the physical etching, in which case a reaction product adheres to the inner wall of a chamber without volatilizing. An adhering film, formed as a result of the adhesion of the reaction product to the inner wall of the chamber, peels off therefrom and causes the generation of particles. In particular, when the chamber is a quartz chamber, the adhering film undergoes a thermal stress due to a difference in thermal expansion coefficient between quartz and the reaction product, e.g. Pt, and easily peels off from the inner wall of the chamber.

SUMMARY OF THE INVENTION

It is accordingly an object of the present invention to provide a semiconductor device manufacturing method which can reduce the generation of particles by preventing the peeling off of the adhering film which has adhered to the inner wall of the chamber.

According to one aspect of the present invention, there is provided a semiconductor device manufacturing method comprising the carbon-containing film adhering step of adhering a carbon-containing film which is made of a carbon-containing material to an inner wall of a chamber; the arranging step of arranging a semiconductor substrate in the chamber whose inner wall has the carbon-containing film adhered thereto; and the etching step of etching a part of a surface layer of the semiconductor substrate by generating a plasma of a process gas which contains a rare gas in the chamber and by applying an electric field which causes ions, contained in the plasma, to be attracted to a surface of the semiconductor substrate.

The carbon-containing film serves as an adhesive layer, which prevents the peeling off of a film which has adhered to the inner wall of the chamber during the etching step. Accordingly, the generation of particles due to the peeling off of such an adhering film is reduced.

According to another aspect of the present invention, there is provided a semiconductor device manufacturing method comprising: the arranging step of arranging a semiconductor substrate in a chamber; and the carbon-containing film adhering step of adhering a carbon-containing film which contains carbon to an inner wall of the chamber, while etching a part of a surface layer of the semiconductor substrate by generating a plasma of a process gas which contains a rare gas and a carbon-containing gas in the chamber and by applying an electric field which causes ions, contained in the plasma, to be attracted to a surface of the semiconductor substrate.

The film which has adhered to the inner wall of the chamber during the etching step contains carbon and consequently is not susceptible to peeling off. This ensures a reduction in the generation of particles due to the peeling off of such an adhering film.

Thus, by adhering the carbon-containing film to the inner wall of the vacuum chamber as described above, the peeling off of an adhering film which has adhered thereto is prevented, ensuring a reduction in the generation of particles.

BRIEF DESCRIPTION OF THE DRAWINGS

FIG. 3A is a sectional view of a to-be-etched wafer which is used in the etching methods according to the first and fourth embodiments of the present invention, while

FIG. 4A is a sectional view of a to-be-etched wafer which is used in the etching methods according to the second and third embodiments of the present invention; while

DETAILED DESCRIPTION OF THE PREFERRED EMBODIMENTS

Figure 1:
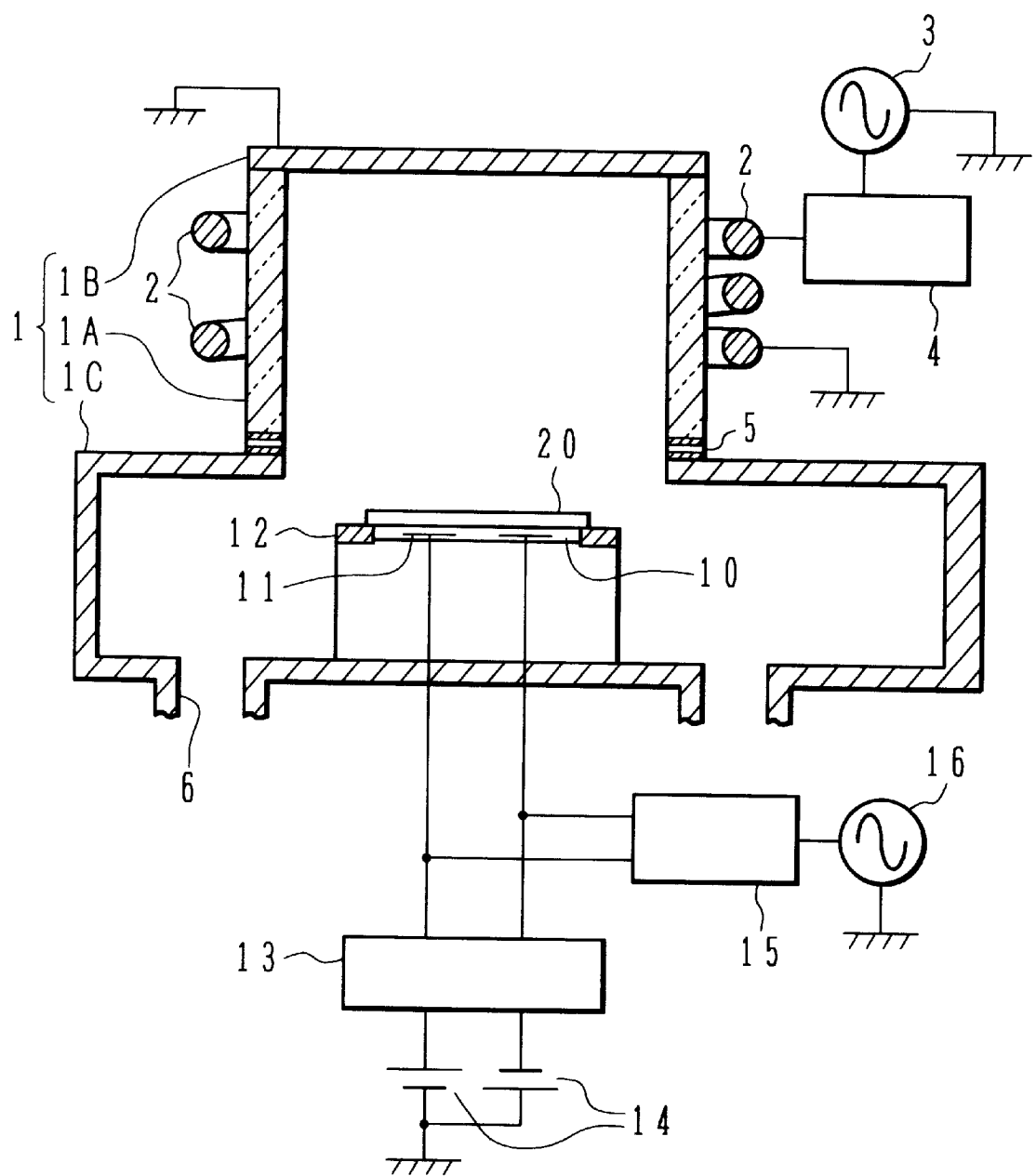
FIG. 1 is a diagrammatic sectional view of a plasma etching apparatus which is used in embodiments of the present invention.

FIG. 1 is a diagrammatic sectional view of the plasma etching apparatus which is employed in embodiments of the present invention. A vacuum chamber 1 includes a cylindrical bell jar 1A which is made of quartz, its hatch 1B and a lower chamber 1C. The hatch 1B is made of aluminum, for example, and is connected to the ground potential. The lower chamber 1C is made of stainless steel, for example. A gas introducing hole 5 is provided at a coupling portion where the bell jar 1A and the lower chamber 1C are coupled to each other. A gas evacuating hole 6 is provided at the bottom of the lower chamber 1C. The vacuum evacuation of the vacuum chamber 1 can be performed through the gas evacuating hole 6.

An antenna 2 is wound in a coil shape around the bell jar 1A. One end of the antenna 2 is connected to the ground. The other end of the antenna 2 is connected to a high-frequency power source 3, with a matching circuit 4 in between. The high-frequency power source 3 outputs a high-frequency power having a frequency of 13.56 MHz.

A wafer stage 10 is arranged in the lower inner space of the bell jar 1A. A wafer 20 is fixed on the upper face of the wafer stage 10 by an electrostatic chuck 11. Of the upper face of the wafer stage 10, that part which is located around the wafer 20 on the wafer stage 10 is an exposed face of a quartz cover 12.

A DC power source 14 applies a DC voltage to the electrostatic chuck 11 through a low pass filter 13. A bias power source 16 applies a bias voltage to the electrostatic chuck 11 through the matching circuit 15. The bias power source 16 generates an RF voltage having a frequency of 460 kHz. By the bias voltage applied to the wafer stage 10, an alternating electric field is generated in the bell jar 1A.

A process gas is introduced into the vacuum chamber through the gas introducing hole 5. When the high-frequency power is supplied to the antenna 2, a plasma is generated in the bell jar 1A due to inductive coupling. When the bias voltage is applied to the wafer stage 10, the ions contained in the plasma are attracted to the wafer 20 in a predetermined half period and impinge on the wafer 20. A thin film which has been formed on the wafer 20 and which is made of Pt or the like is physically etched by the ions impinging thereon.

The etching method according to the first embodiment of the present invention will now be described with reference to FIGS. 2A to 2C and FIGS. 3A and 3B.

Figure 3A:
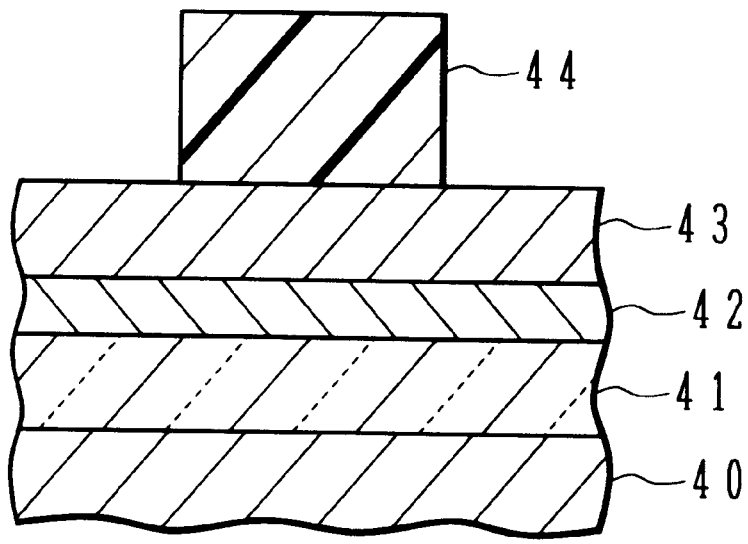

FIG. 3A is a sectional view of a substrate to be subjected to plasma etching. An $SiO_2$ film 41 having a thickness of 100 nm, a Ti film 42 having a thickness of 20 nm and a Pt film 43 having a thickness of 175 nm are laminated in the order of description on the silicon substrate 40. The Ti film 42 ensures the adhesion of the Pt film 43 to the $SiO_2$ film 41. A resist pattern 44 is formed on the Pt film 43.

Firstly, twenty-five silicon wafers, each having a major surface on the entirety of which an i-line novolak-series photoresist film has been formed, are sequentially subjected to plasma processing by using the plasma etching apparatus illustrated in FIG. 1. $Cl_2$ gas and Ar gas are employed. The flow rate of the $Cl_2$ gas is set at 32 sccm, while the flow rate of the Ar gas is set at 20 sccm. The pressure is 5 mTorr, the high-frequency electric power for the plasma generation is 1400 W, the bias voltage application power is 700 W, and the processing time is 30 seconds per wafer.

Figure 2A:
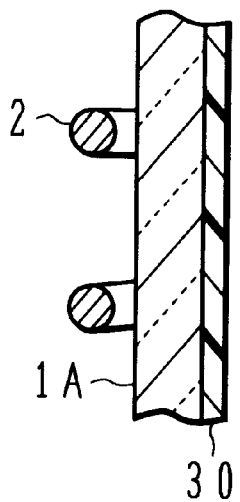
FIGS. 2A to 2C are sectional views of films which adhere to the inner wall of a bell jar when etching is conducted by the etching method according to the first embodiment of the present invention.

FIG. 2A is a sectional view of a part of the bell jar 1A after the plasma processing of the twenty-five wafers. As a result of resist films on those wafers being physically etched and adhering to the inner wall of the bell jar 1A, a carbon-containing film 30, made of a material which contains carbon, is formed on the inner wall of the bell jar 1A.

Next, the Pt films 43 and Ti films 42 of wafers, which are identical with the wafer illustrated in FIG. 3A, are subjected to plasma etching. The etching conditions are the same as those for the plasma processing of the silicon wafers each having a major surface on the entirety of which the resist film has been formed.

Figure 3B:
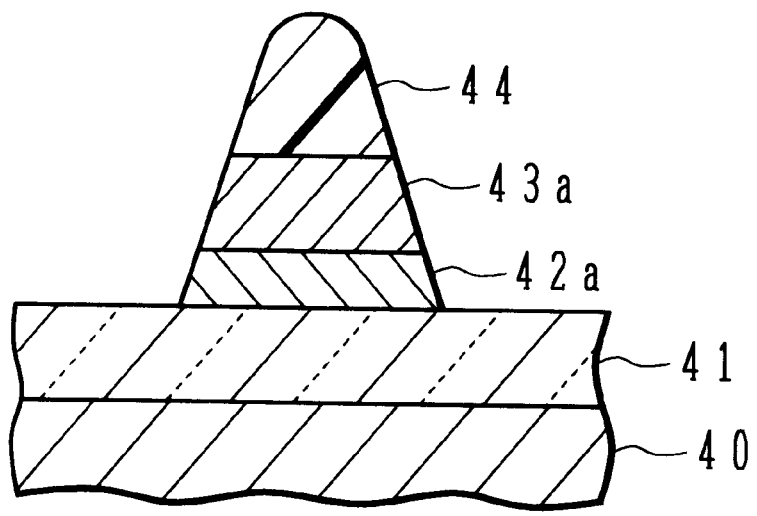
FIG. 3B is a sectional view of the wafer after etched.

FIG. 3B is a sectional view of an etched wafer. A Pt film 43a and a Ti film 42a are left in the area masked by the resist pattern 44. Since the resist pattern 44 itself is also etched gradually, a laminated structure which includes the Pt film 43a and the Ti film 42a is trapezoidal in cross section. Fifty wafers are processed under the same conditions as those described previously.

Figure 2B:
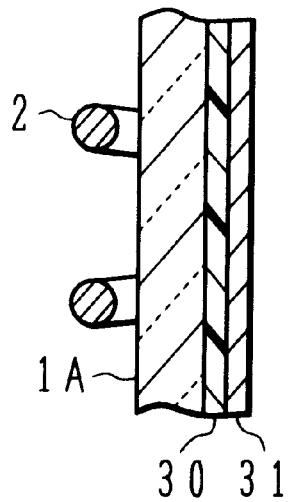

FIG. 2B is a sectional view of a part of the bell jar 1A after the etching of the Pt films 43 and the Ti films 42. An adhering film 31, which contains Pt and Ti, is formed on the carbon-containing film 30. Thereafter, the plasma processing of ten wafers, each having a major surface on the entirety of which the resist film has been formed, and the plasma etching of fifty wafers, which are identical with the wafer illustrated in FIG. 3A, are repeatedly executed.

Figure 2C:
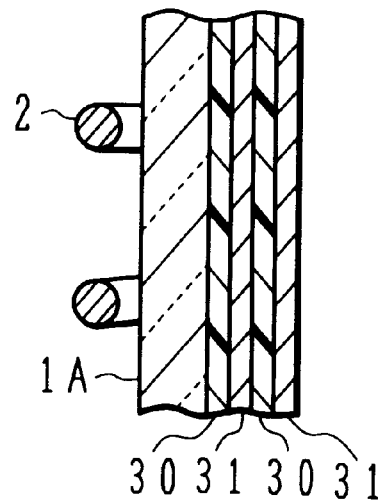

As illustrated in FIG. 2C, the carbon-containing film 30 and the adhering film 31 are alternately formed on the inner wall of the bell jar 1A. In the case where a Pt film adheres directly to the inner wall of the bell jar 1A, the Pt film easily peels off therefrom due to a difference in thermal expansion coefficient between quartz and Pt. In this embodiment, however, the carbon-containing film 30 intervenes between the quartz bell jar 1A and the adhering film 31. The carbon-containing film 30 serves as an adhesive layer which prevents the peeling off of the adhering film 31. The Pt films and the Ti films of three-hundred wafers were actually etched by employing the above-explained method, in which case the peeling off of the adhering film from the inner wall of the bell jar 1A was not detected.

The second embodiment will now be described. In the first embodiment, the Pt films and the Ti films are subjected to the plasma etching, whereas in the second embodiment, PZT (Pb, Zr, Ti, O) films are subjected to the plasma etching.

Figure 4A:
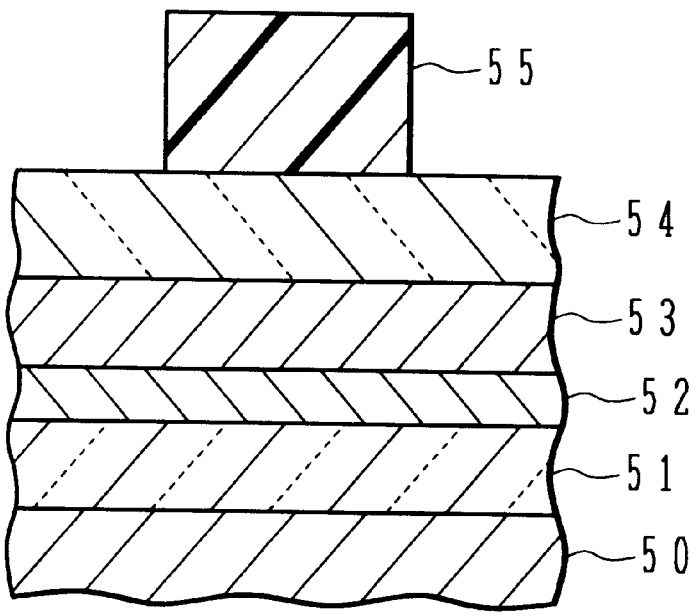
Figure 4B:
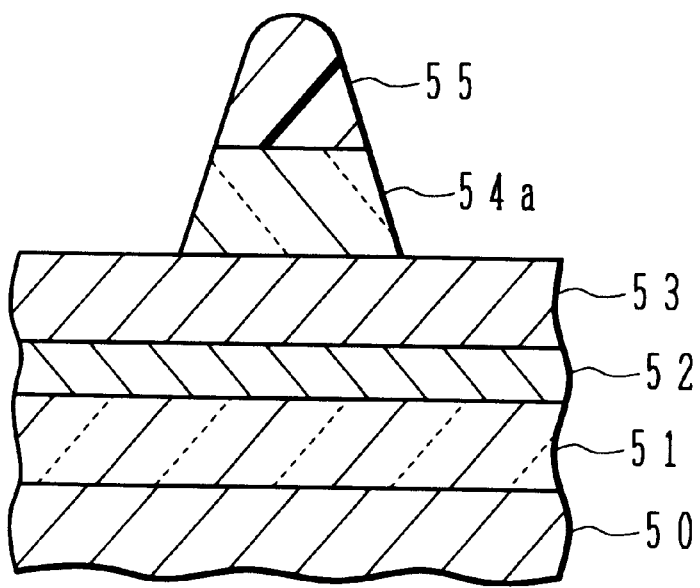
FIG. 4B is a sectional view of the wafer after etched.

FIG. 4A is a sectional view of a wafer having a PZT film formed thereon. An $SiO_2$ film 51 having a thickness of 100 nm, a Ti film 52 having a thickness of 20 nm, a Pt film 53 having a thickness of 175 nm and a PZT film 54 having a thickness of 240 nm, are laminated in the order of description on the silicon wafer 50. A resist pattern 55 is formed on the PZT film 54.

The PZT film 54 can be etched using $CF_4$ gas and Ar gas, for example, and under the conditions wherein the flow rate of the $CF_4$ gas is 24 sccm and the flow rate of the Ar gas is 20 sccm. The pressure, the high-frequency electric power and the bias voltage application power are the same as those in the case of etching the Pt films. By conducting the etching for fifty seconds under these conditions, the PZT film 54 can be etched through its overall thickness.

The Pt films 54 of three-hundred wafers were actually etched by employing the same method as that for etching the Pt films in the first embodiment. In this case also, the peeling off of the adhering film from the inner wall of the bell jar 1A was not detected after the etching.

In the above-described embodiments, wafers having resist films formed thereon are subjected to the plasma processing before the plasma etching, in order to adhere the carbon-containing film to the inner wall of the bell jar 1A. However, wafers having organic films other than the resist films can also be employed insofar as such a carbon-containing film can adhere to the inner wall of the bell jar 1A. In this case, any constituent of the organic films adheres to the inner wall of the bell jar 1A.

It is preferred that at least 80% of a wafer's major surface be covered with an organic film, in order to permit a constituent or constituents of the organic film to efficiently adhere to the inner wall of the bell jar 1A.

The third embodiment of the present invention will now be described with reference to FIGS. 5A and 5B. In the plasma etching apparatus used in the third embodiment, the hatch 1B and the cover 12 are made of carbon, unlike in the case of the plasma etching apparatus illustrated in FIG. 1. In other respects, the plasma etching apparatus used in the third embodiment is identical with that illustrated in FIG. 1. The PZT films to be etched are identical with the PZT film illustrated in FIG. 4A of the second embodiment.

As in the case of the first embodiment, twenty-five wafers, each having a major surface on the entirety of which the resist film has been formed, are sequentially subjected to the plasma processing.

Figure 5A:
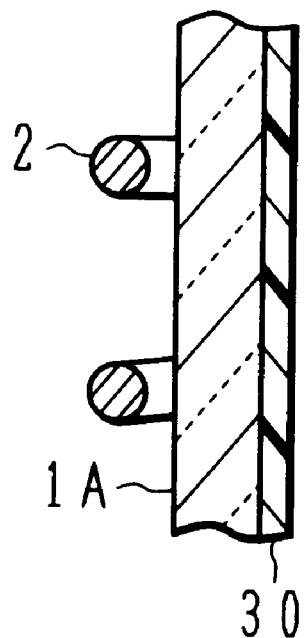
FIGS. 5A and 5B are sectional views of films which adhere to the inner wall of the bell jar when etching is conducted by the etching method according to the third embodiment of the present invention.

As illustrated in FIG. 5A, the carbon-containing film 30 adheres to the inner wall of the bell jar 1A, as in the case of FIG. 2A.

PZT films 54, which are identical with the PZT film illustrated in FIG. 4A, are etched by the same method as that of the second embodiment. According to the second embodiment, ten wafers each having a major surface on the entirety of which the resist film has been formed are subjected to the plasma processing each time the PZT films of fifty wafers are etched. According to the third embodiment, however, the PZT films of three-hundred wafers are etched consecutively.

Figure 5B:
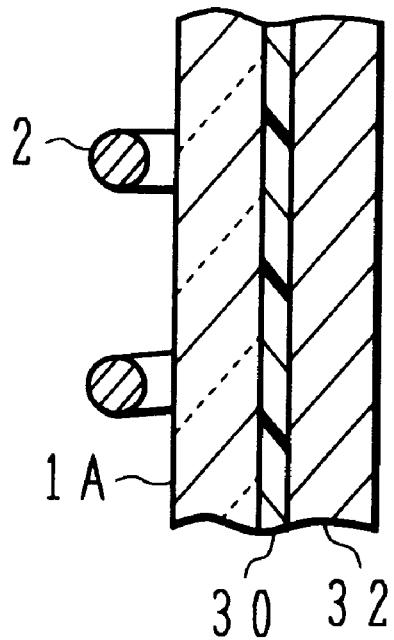

FIG. 5B is a sectional view of a part of the bell jar 1A after the PZT films of the three-hundred wafers have been etched. During the plasma etching, an adhering film 32 which contains any constituent of the etched films adheres to the surface of the carbon-containing film 30. The adhering film 32 contains carbon, as well as any constituent of the PZT films. The carbon contained in the adhering film 32 is supplied due to the hatch 1B and the cover 12 of FIG. 1 being etched partially.

The carbon-containing film 30 serves as the adhesive layer, which prevents the peeling off of the adhering film 32. Since the adhering film 32 contains not only any constituent of the PZT films but also carbon, the adhering film 32 is more insusceptible of peeling off than in the case of a film which contains any constituent of the PZT films only. Consequently, three-hundred wafers were actually processed consecutively, the peeling off of the adhering film 32 was not detected because of the above.

The apparatus in which the hatch 1B and the cover 12 of FIG. 1 are made of carbon is employed in the third embodiment. However, the same advantage as one described above can be expected even if the apparatus is designed so that at least one part of the inner wall of the vacuum chamber 1 is formed of a material which contains carbon and the carbon is etched by a plasma.

The fourth embodiment of the present invention will now be described. The first embodiment uses $Cl_2$ gas and Ar gas as the etching gasses, and the fourth embodiment additionally uses $C_2F_6$ gas. The flow rate of the $C_2F$, gas is 5 sccm. Other etching conditions are the same as in the case of the first embodiment.

Firstly, twenty-five wafers, each having a major surface on the entirety of which the resist film has been formed, are subjected to the plasma etching in the atmosphere which additionally contains the $C_2F_6$ gas. Thereafter, the Pt films 43 of wafers, which are identical with the wafer illustrated in FIG. 3A, are subjected to the plasma etching. According to the first embodiment, ten wafers, each having a major surface on the entirety of which the resist film has been formed, are subjected to the plasma etching each time the Pt films of fifty wafers are etched. According to the fourth embodiment, however, the Pt films of three-hundred wafers are etched consecutively.

In this case also, the adhering film 32 illustrated in FIG. 5B is formed as well as in the case of the third embodiment. The adhering film 32 contains Pt and carbon. This carbon is supplied due to the decomposition of $C_2F_6$ contained in one etching gas. When three-hundred wafers were actually processed consecutively, the peeling off of the adhering film 32 was not detected, because of the carbon contained in the adhering film 32.

In the fourth embodiment described above, the $C_2F_6$ gas is added to the etching gasses. However, any other gas can be added if the adhering film 32 can contain carbon. For example, at least one gas selected from the group which consists of $CH_4$, $CH_2F_2$, $CHF_3$, $C_2F_6$, $C_3F_6$, $C_3F_8$ and $C_4F_8$ can be added.

According to the third and fourth embodiments, the adhering film 32 illustrated in FIG. 5B adheres to the inner wall of the bell jar 1A during the etching of the Pt films or the PZT films. Since the adhering film 32 itself contains carbon, a relatively high degree of adhesion can be attained between the quarts bell jar 1A and the adhering film 32 even if the carbon-containing film 30 is not adhered to the inner wall of the bell jar 1A.

The fifth embodiment of the present invention will now be described. According to the first embodiment, wafers each having a major surface on the entirety of which the resist film has been formed are subjected to the plasma processing, in order to adhere the carbon-containing film 30 illustrated in FIG. 2A to the inner wall of the bell jar 1A. According to the fifth embodiment, a dummy discharge is effected by using a gas which contains $C_2F_6$ gas and Ar gas, in order to adhere the carbon-containing film 30 to the inner wall of the bell jar 1A.

The dummy discharge is performed under the conditions wherein the flow rate of the $C_2F_6$ gas is 32 sccm, the flow rate of the Ar gas is 20 sccm, the pressure is 5 mTorr, the high-frequency electric power for the plasma generation is 1400 W, and the bias voltage application power is 100 W. In this case, an $SiO_2$ wafer is mounted as a dummy wafer on the wafer stage 10.

Firstly, the dummy discharge is performed for ten minutes. Thereafter, the etching of the Pt films of fifty wafers and the dummy discharge for two minutes are repeated. After the Pt films of three-hundred wafers in total were actually etched, the peeling off of a Pt film adhered to the inner wall of the bell jar 1A was not detected.

Although the bias voltage application power during the etching of the Pt films is 700 W, the bias voltage application power during the dummy discharge is 100 W, due to which the $SiO_2$ wafer is hardly etched during the dummy discharge. The bias voltage may not be necessarily applied during the dummy discharge.

The case of etching the Pt films has been explained in the first embodiment. However, it was confirmed that the same advantage as that described previously can be attained also in the case of etching the PZT films.

In the fifth embodiment, the dummy discharge is performed in the mixed atmosphere which contains $C_2F_6$ and Ar. However, such a gas that the carbon-containing film adheres to the inner wall of the bell jar 1A can be adopted in place of $C_2F_6$. For example, at least one gas selected from the group which consists of $CH_4$, $CH_2F_2$, $CHF_3$, $C_2F_6$, $C_3F_6$, $C_3F_8$ and $C_4F_8$ can be adopted.

The etching of the Pt films and the PZT films has been explained in the above-described first to fifth embodiments. The issue of the adhering film being susceptible to peeling off from the inner wall of the bell jar 1A is common to such cases as when etching is performed mainly by the physical etching and any constituent of the etched films adheres again to the inner wall of the bell jar. In other words, the above issue is common to such cases as when films, made of a material whose vapor pressure is so low that chemical etching is difficult, are etched. The same advantage as that of the first to fifth embodiments can be expected also in the case of etching films made of Ir, IrO, $SrBi_2Ta_2O_9$ (SBT) or $Ba_xSr_{1-x}TiO_3$ (BST) other than Pt and PZT.

In the above-described embodiments, a gas which contains Ar is used as a process gas. However, rare gasses other than Ar may be adopted. Furthermore, in the above embodiments, the use of an inductive coupling type plasma etching apparatus has been explained. However, the same advantage as that described previously can be expected also in the case of using a parallel plate (capacitive coupling) type apparatus, an electron cyclotron resonance (ECR) type apparatus and a helicon type apparatus.

The present invention has been explained along with the embodiments. However, the present invention is not limited to them, and various changes, improvements, combinations, etc. are possible, as should be apparent to a person skilled in the art.

What is claimed is:

1. A semiconductor device manufacturing method comprising the steps of:

adhering a carbon-containing film which is made of a carbon-containing material to an inner wall of a chamber;

arranging a semiconductor substrate in said chamber whose inner wall has said carbon-containing film adhered thereto; and etching a part of a surface layer of said semiconductor substrate by generating a plasma of a process gas which contains a rare gas in said chamber and by applying an electric field which causes ions, contained in said plasma, to be attracted to a surface of said semiconductor substrate.

2. The semiconductor device manufacturing method according to claim 1, wherein said carbon-containing film adhering step includes:

arranging in said chamber a substrate whose major surface has an organic film formed thereon; and removing a part of said organic film by generating a plasma in said chamber, and adhering a constituent removed from said organic film to the inner wall of said chamber.

3. The semiconductor device manufacturing method according to claim 2, wherein at least 80% of the major surface of said substrate is covered with said organic film.

4. The semiconductor device manufacturing method according to claim 2, wherein said organic film is a photoresist film.

5. The semiconductor device manufacturing method according to claim 1, wherein:

at least one portion of the inner wall of said chamber is made of a carbon-containing material; and in said carbon-containing film adhering step, a plasma is generated, of the inner wall of said chamber, at least said one portion which is made of the carbon-containing material is etched, and said carbon-containing film is adhered to other portions of the inner wall of said chamber.

6. The semiconductor device manufacturing method according to claim 1, wherein said carbon-containing film adhering step includes:

arranging a dummy substrate in said chamber; and generating a plasma in said chamber by introducing a carbon-containing gas into said chamber, and adhering said carbon-containing film to the inner wall of said chamber.

7. The semiconductor device manufacturing method according to claim 6, wherein said carbon-containing gas is at least one gas selected from a group consisting of $CH_4$, $CH_2F_2$, $CHF_3$, $C_2F_6$, $C_3F_6$, $C_3F_8$ and $C_4F_8$.

8. The semiconductor device manufacturing method according to claim 1, wherein:

the surface of said semiconductor substrate has a to-be-etched film formed thereon and which is made of at least one material selected from a group consisting of Pt, Ir, IrO, PZT, SBT and BST; and said to-be-etched film is partially etched in said etching step of etching a part of the surface layer of said semiconductor substrate.

9. A semiconductor device manufacturing method comprising:

arranging a semiconductor substrate in a chamber; and adhering step of adhering a carbon-containing film which contains carbon to an inner wall of said chamber, while etching a part of a surface layer of said semiconductor substrate by generating a plasma of a process gas which contains a rare gas and a carbon-containing gas in said chamber and by applying an electric field which causes ions, contained in said plasma, to be attracted to a surface of said semiconductor substrate.

10. The semiconductor device manufacturing method according to claim 9, wherein said carbon-containing gas is at least one gas selected from a group consisting of $CH_4$, $CH_2F_2$, $CHF_3$, $C_2F_6$, $C_3F_6$, $C_3F_8$ and $C_4F_8$.

11. The semiconductor device manufacturing method according to claim 9, wherein:

the surface of said semiconductor substrate has a to-be-etched film formed thereon and which is made of at least one material selected from a group consisting of Pt, Ir, IrO, PZT, SBT and BST; and said to-be-etched film is partially etched when etching a part of the surface layer of said semiconductor substrate.

* * * * *